(12) United States Patent
Yang et al.

(10) Patent No.: US 10,789,442 B2
(45) Date of Patent: Sep. 29, 2020

(54) FINGERPRINT RECOGNITION AND PIXEL DRIVING CIRCUIT, AND DISPLAY DEVICE COMPRISING THE SAME

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Minghua Xuan, Beijing (CN); Weifeng Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/322,027

(22) PCT Filed: May 18, 2018

(86) PCT No.: PCT/CN2018/087447
§ 371 (c)(1),
(2) Date: Jan. 30, 2019

(87) PCT Pub. No.: WO2018/233416
PCT Pub. Date: Dec. 27, 2018

(65) Prior Publication Data
US 2019/0188444 A1 Jun. 20, 2019

(30) Foreign Application Priority Data
Jun. 23, 2017 (CN) .......................... 2017 1 0486499

(51) Int. Cl.
*G06K 9/00* (2006.01)
*H01L 27/32* (2006.01)
*G09G 3/3233* (2016.01)

(52) U.S. Cl.
CPC ..... *G06K 9/00013* (2013.01); *G06K 9/00006* (2013.01); *G09G 3/3233* (2013.01);
(Continued)

(58) Field of Classification Search
None
See application file for complete search history.

(56) References Cited

U.S. PATENT DOCUMENTS

2007/0216657 A1 9/2007 Konicek
2014/0292666 A1 10/2014 Shi et al.
(Continued)

FOREIGN PATENT DOCUMENTS

CN 103996377 A 8/2014
CN 104103239 A 10/2014
(Continued)

OTHER PUBLICATIONS

International Search Report and Written Opinion of the International Searching Authority (with English language translation of Written Opinion), International Application No. PCT/CN2018/087447, dated Jul. 27, 2018, 14 pp.
(Continued)

*Primary Examiner* — Christopher J Kohlman
(74) *Attorney, Agent, or Firm* — Myers Bigel, P.A.

(57) ABSTRACT

A fingerprint recognition and pixel driving circuit and a display device including the circuit are provided. The circuit includes a first scan line, a second scan line, a third scan line, a light emission control line and a data writing line, a pixel driving sub-circuit for driving a light emitting element of a pixel to emit light according to the first scan signal, the second scan signal, the third scan signal, the light emission control signal, and the data signal, a fingerprint recognition sub-circuit that receives any two of the first scan signal, the second scan signal and the third scan signal through a first (Continued)

read terminal and a reset terminal to generate fingerprint data of a finger based on any two of the first scan signal, the second scan signal and the third scan signal, thereby realizing integration of the fingerprint recognition function with the pixel driving function.

12 Claims, 11 Drawing Sheets

(52) U.S. Cl.
CPC . *H01L 27/3234* (2013.01); *G09G 2300/0861* (2013.01); *G09G 2310/0262* (2013.01); *G09G 2354/00* (2013.01)

(56) References Cited

U.S. PATENT DOCUMENTS

2016/0140380 A1    5/2016    Carver et al.
2016/0260380 A1    9/2016    Yang
2016/0266688 A1*   9/2016    Yang ................... G09G 3/3225
2017/0103706 A1*   4/2017    Yang ................... G06F 3/0416
2019/0188444 A1    6/2019    Yang et al.

FOREIGN PATENT DOCUMENTS

| | | |
|---|---|---|
| CN | 104112120 A | 10/2014 |
| CN | 104778923 A | 7/2015 |
| CN | 107180611 A | 9/2017 |
| KR | 10-2005-0037840 A | 4/2005 |

OTHER PUBLICATIONS

First Office Action with English language translation, CN Application No. 201710486499.5, dated Oct. 31, 2018, 22 pp.

\* cited by examiner

FINGERPRINT RECOGNITION AND PIXEL DRIVING CIRCUIT, AND DISPLAY DEVICE COMPRISING THE SAME

CROSS REFERENCE TO RELATED APPLICATIONS

The present application is a 35 U.S.C. 371 national stage application of PCT International Application No. PCT/CN2018/087447, filed on May 18, 2018, which claims the benefit of Chinese Patent Application No. 201710486499.5, filed on Jun. 23, 2017, the contents of which are incorporated herein by reference in their entireties. The above-referenced PCT International Application was published in the Chinese language as International Publication No. WO 2018/233416 A1 on Dec. 27, 2018.

TECHNICAL FIELD

The present disclosure relates to the field of display technologies, and particularly to a fingerprint recognition and pixel driving circuit, and a display device comprising the circuit.

BACKGROUND

Design of a pixel driving circuit is a core technology for organic light emitting displays such as active matrix organic light emitting diode (AMOLED) displays. Organic light emitting diodes (OLEDs) are current-driven devices and require a constant current to control light emission. However, due to process procedures, device aging and other factors, in a pixel driving circuit, threshold voltages of the driving transistors for respective pixels are not uniform, which causes the current flowing through the OLED of each pixel to vary, thereby affecting the display effect of the entire image.

In addition, a capacitive fingerprint recognition technology can be implemented based on the semiconductor silicon capacitance effect. With this fingerprint recognition technology, an image of fingerprint recognition is good in quality, generally undistorted, small in size and high in security. However, the pixel driving circuit and the fingerprint recognition circuit are usually disposed individually, thus the functions thereof are just simply accumulated and combined.

SUMMARY

Embodiments of the present disclosure propose a fingerprint recognition and pixel driving circuit and a display device comprising such a circuit.

An embodiment of the disclosure provides a fingerprint recognition and pixel driving circuit, which comprises: a first scan line, a second scan line, a third scan line, a light emission control line, and a data writing line; a pixel driving sub-circuit, the pixel driving sub-circuit comprising a first scan terminal, a second scan terminal, a third scan terminal, a light emission control terminal, and a data writing terminal, the first scan terminal of the pixel driving sub-circuit is electrically connected to the first scan line to receive a first scan signal, the second scan terminal of the pixel driving sub-circuit is electrically connected to the second scan line to receive a second scan signal, the third scan terminal of the pixel driving sub-circuit is electrically connected to the third scan line to receive a third scan signal, the light emission control terminal of the pixel driving sub-circuit is electrically connected to the light emission control line to receive a light emission control signal, and the data writing terminal of the pixel driving sub-circuit is electrically connected to the data writing line to receive a data signal, the pixel driving sub-circuit drives a light emitting element of a pixel to emit light according to the first scan signal, the second scan signal, the third scan signal, the light emission control signal and the data signal; a fingerprint recognition sub-circuit, the fingerprint recognition sub-circuit comprising a first read terminal and a reset terminal, the first read terminal and the reset terminal are electrically connected to any two of the first scan line, the second scan line and the third scan line, respectively, so as to generate fingerprint data based on any two of the first scan signal, the second scan signal and the third scan signal.

In some embodiments, the fingerprint recognition and pixel driving circuit further comprises a read line, the fingerprint recognition sub-circuit further comprises a second read terminal electrically connected to the read line, and the fingerprint recognition sub-circuit outputs the fingerprint data to the read line through the second read terminal.

In some embodiments, the fingerprint recognition sub-circuit comprises a reset signal providing terminal configured to provide a reset signal, and a detection electrode configured to form a detection capacitance with a finger. The fingerprint recognition sub-circuit is configured to reset a potential of the detection electrode with the reset signal of the reset signal providing terminal in response to receiving an effective level signal from the reset terminal.

In some embodiments, the fingerprint recognition sub-circuit further comprises: a reference capacitor, a first terminal of the reference capacitor being electrically connected to the detection electrode to form a first node with the detection electrode; a first transistor, a control terminal of the first transistor serving as the reset terminal of the fingerprint recognition sub-circuit, a first terminal of the first transistor being electrically connected to the reset signal providing terminal, and a second terminal of the first transistor being electrically connected to the first node; a second transistor, a control terminal of the second transistor being electrically connected to the first node, and a first terminal of the second transistor being electrically connected to the reset signal providing terminal; a third transistor, a control terminal of the third transistor being electrically connected to a second terminal of the reference capacitor to form a second node with the reference capacitor, a first terminal of the third transistor being electrically connected to a second terminal of the second transistor, a second terminal of the third transistor serving as the second read terminal of the fingerprint recognition sub-circuit, and the second node serving as the first read terminal of the fingerprint recognition sub-circuit.

In some embodiments, the first read terminal of the fingerprint recognition sub-circuit is electrically connected to the third scan line, and the reset terminal of the fingerprint recognition sub-circuit is electrically connected to the second scan line.

In some embodiments, the first read terminal of the fingerprint recognition sub-circuit is electrically connected to the first scan line, and the reset terminal of the fingerprint recognition sub-circuit is electrically connected to the second scan line.

In some embodiments, the first read terminal of the fingerprint recognition sub-circuit is electrically connected to the first scan line, and the reset terminal of the fingerprint recognition sub-circuit is electrically connected to the third scan line.

In some embodiments, the pixel driving sub-circuit comprises: a driving transistor configured to drive the light emitting element of the pixel to emit light; a threshold voltage compensation circuit electrically connected to the driving transistor, which is configured to compensate a voltage of a control terminal of the driving transistor so as to eliminate an influence of a threshold voltage of the driving transistor on a light emitting current when the light emitting element emits light.

In some embodiments, the pixel driving sub-circuit further comprises: a fourth transistor, a control terminal of the fourth transistor serving as the light emission control terminal of the pixel driving sub-circuit, a first terminal of the fourth transistor being configured to receive a power supply voltage, a second terminal of the fourth transistor being electrically connected to a first terminal of the driving transistor, a second terminal and a control terminal of the driving transistor being electrically connected to the threshold voltage compensation circuit, a seventh transistor, a first terminal of the seventh transistor being electrically connected to the second terminal of the driving transistor, a second terminal of the seventh transistor being electrically connected to the light emitting element, and a control terminal of the seventh transistor being electrically connected to the threshold voltage compensation circuit.

In some embodiments, the threshold voltage compensation circuit comprises: a storage capacitor, a first terminal of the storage capacitor being electrically connected to the control terminal of the driving transistor to form a third node with the control terminal of the driving transistor; a fifth transistor, a first terminal of the fifth transistor being grounded, and a second terminal of the fifth transistor being electrically connected to a second terminal of the storage capacitor to form a fourth node with the second terminal of the storage capacitor; a sixth transistor, a control terminal of the sixth transistor being electrically connected to a control terminal of the fifth transistor and serving as the third scan terminal of the pixel driving sub-circuit, a first terminal of the sixth transistor being electrically connected to the third node, and a second terminal of the sixth transistor being electrically connected to the second terminal of the driving transistor; an eighth transistor, a control terminal of the eighth transistor being electrically connected to the control terminal of the seventh transistor and serving as the first scan terminal of the pixel driving sub-circuit, a first terminal of the eighth transistor serving as the data writing terminal of the pixel driving sub-circuit, and a second terminal of the eighth transistor being electrically connected to the fourth node; a ninth transistor, a control terminal of the ninth transistor serving as the second scan terminal of the pixel driving sub-circuit, a first terminal of the ninth transistor being grounded, a second terminal of the ninth transistor being electrically connected to the third node.

In some embodiments, an operating process of the fingerprint recognition sub-circuit comprises a fingerprint recognition reset phase and a fingerprint acquisition phase successively, in the fingerprint recognition reset phase, the second transistor and the third transistor are turned off, the first transistor is turned on, and the reset signal resets the potential of the detection electrode by means of the first transistor; in the fingerprint acquisition phase, the first transistor is turned off, and the second transistor generates a drain current according to a value of the detection capacitance, and outputs the drain current through the third transistor.

In some embodiments, the driving transistor and the first transistor to the ninth transistor are all P-type transistors.

In some embodiments, an operating process of the pixel driving sub-circuit comprises a display reset phase, a display charging phase, a compensation transition phase, and a light emitting phase successively, in the display reset phase, the second scan signal is at a low level, the first scan signal, the third scan signal, and the light emission control signal are at a high level, the fourth transistor to the eighth transistor are turned off, and the ninth transistor is turned on to reset the storage capacitor; in the display charging phase, the light emission control signal and the third scan signal are at a low level, the first scan signal and the second scan signal are at a high level, the seventh transistor, the eighth transistor and the ninth transistor are turned off, the fourth transistor, the fifth transistor, the sixth transistor and the driving transistor are turned on, and the power supply voltage charges the storage capacitor through the fourth transistor, the driving transistor, and the sixth transistor; in the compensation transition phase, the first scan signal is at a low level, the light emission control signal, the second scan signal, and the third scan signal are at a high level, the fourth transistor, the fifth transistor, the sixth transistor and the ninth transistor are turned off, the seventh transistor and the eighth transistor are turned on, and a potential of the control terminal of the driving transistor varies according to the data signal; in the light emitting phase, the first scan signal and the light emission control signal are at a low level, the second scan signal and the third scan signal are at a high level, the fifth transistor, the sixth transistor and the ninth transistor are turned off, the fourth transistor, the seventh transistor and the eighth transistor are turned on, and the driving transistor generates the light emitting current according to the potential of the control terminal of the driving transistor, and provides the light emitting current to the light emitting element through the seventh transistor to make the light emitting element emit light.

In some embodiments, the first read terminal of the fingerprint recognition sub-circuit is electrically connected to the third scan line, the reset terminal of the fingerprint recognition sub-circuit is electrically connected to the second scan line, the fingerprint recognition reset phase of the fingerprint recognition sub-circuit coincides with the display reset phase of the pixel driving sub-circuit, the fingerprint acquisition phase of the fingerprint recognition sub-circuit coincides with the display charging phase of the pixel driving sub-circuit, and the fingerprint recognition sub-circuit stops operating during the compensation transition phase and the light emitting phase of the pixel driving sub-circuit.

In some embodiments, the first read terminal of the fingerprint recognition sub-circuit is electrically connected to the first scan line, and the reset terminal of the fingerprint recognition sub-circuit is electrically connected to the second scan line, the fingerprint recognition reset phase of the fingerprint recognition sub-circuit coincides with the display reset phase of the pixel driving sub-circuit, the fingerprint acquisition phase of the fingerprint recognition sub-circuit covers the compensation transition phase and the light emitting phase of the pixel driving sub-circuit, and the fingerprint recognition sub-circuit stops operating during the display charging phase of the pixel driving sub-circuit.

In some embodiments, the first read terminal of the fingerprint recognition sub-circuit is electrically connected to the first scan line, and the reset terminal of the fingerprint recognition sub-circuit is electrically connected to the third scan line, the fingerprint recognition reset phase of the fingerprint recognition sub-circuit coincides with the display charging phase of the pixel driving sub-circuit, the fingerprint acquisition phase of the fingerprint recognition sub-circuit covers the compensation transition phase and the light emitting phase of the pixel driving sub-circuit, and the fingerprint recognition sub-circuit stops operating during the display reset phase of the pixel driving sub-circuit.

A further embodiment of the disclosure provides a display device comprising a plurality of fingerprint recognition and pixel driving circuits according to any of above-described embodiments.

In some embodiments, two adjacent ones of the plurality of fingerprint recognition and pixel driving circuits are separated by at least one pixel.

REFERENCE NUMERALS

Figure 1:
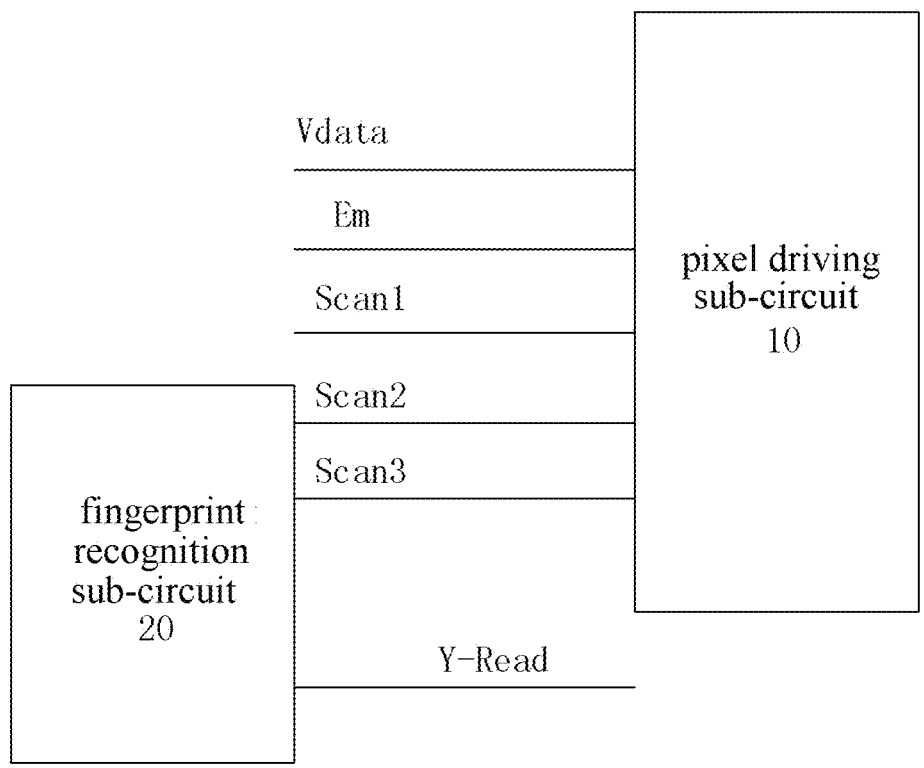
FIG. 1 is a block schematic diagram of a fingerprint recognition and pixel driving circuit according to an embodiment of the disclosure.

Scan1—first scan line, Scan2—second scan line, Scan3—third scan line, Em—light emission control line, Vdata—data writing line, 10—pixel driving sub-circuit, 20—fingerprint recognition sub-circuit, Y-Read—read line; Vcom—reset signal providing terminal, d—detection electrode, Cs—reference capacitor, M1—first transistor, M2—second transistor, M3—third transistor; DTFT—driving transistor, T4—the fourth transistor, Cm—storage capacitor, T5—fifth transistor, T6—sixth transistor, T7—seventh transistor, T8—eighth transistor, T9—ninth transistor.

DETAILED DESCRIPTION OF EMBODIMENTS

Embodiments of the disclosure are described in detail below, and examples of the embodiments are illustrated in the drawings, where the same or similar reference numerals are used to refer to the same or similar elements or elements comprising the same or similar functions. The embodiments described below with reference to the accompanying drawings are illustrative and intended to interpret the present disclosure, which should not be construed as limiting the present disclosure.

A fingerprint recognition and pixel driving circuit and a display device comprising the same proposed by embodiments of the present disclosure will be described below with reference to the accompanying drawings.

FIG. 1 is a block diagram of a fingerprint recognition and pixel driving circuit according to an embodiment of the present disclosure. As shown in FIG. 1, the fingerprint recognition and pixel driving circuit comprises a first scan line Scan1, a second scan line Scan2, a third scan line Scan3, a light emission control line Em, a data writing line Vdata, a pixel driving sub-circuit 10 and a fingerprint recognition sub-circuit 20.

The pixel driving sub-circuit 10 has a first scan terminal, a second scan terminal, a third scan terminal, a light emission control terminal and a data writing terminal. The first scan terminal of the pixel driving sub-circuit 10 is connected to the first scan line Scan1 to receive a first scan signal, the second scan terminal of the pixel driving sub-circuit 10 is connected to the second scan line Scan2 to receive a second scan signal, the third scan terminal of the pixel driving sub-circuit 10 is connected to the third scan line Scan3 to receive a third scan signal, the light emission control terminal of the pixel driving sub-circuit 10 is connected to the light emission control line Em to receive a light emission control signal, and the data writing terminal of the pixel driving sub-circuit 10 is connected to the data writing line Vdata to receive a data signal. The pixel driving sub-circuit 10 drives a light emitting element 30 (e.g., an organic light emitting diode) of a pixel to emit light according to the first scan signal, the second scan signal, the third scan signal, the light emission control signal and the data signal.

The fingerprint recognition sub-circuit 20 has a first read terminal and a reset terminal. The first read terminal and the reset terminal of the fingerprint recognition sub-circuit 20 share any two of the first scan line Scan1, the second scan line Scan2 and the third scan lines Scan3 with the pixel driving sub-circuit 10. The fingerprint recognition sub-circuit 20 receives any two of the first scan signal, the second scan signal and the third scan signal through the first read terminal and the reset terminal, so as to recognize the fingerprint of a finger based on any two of the first scan signal, the second scan signal and the third scan signal to generate fingerprint data of the finger.

It is to be noted that FIG. 1 only illustrates an example in which the first read terminal and the reset terminal of the fingerprint recognition sub-circuit 20 share the second scan line Scan2 and the third scan line Scan3 with the pixel driving sub-circuit 10. Other situations are substantially the same and only differ in connection relationships between the first read terminal, the reset terminal of the fingerprint recognition sub-circuit 20, and the first scan line Scan1, the second scan line Scan2 or the third scan line Scan3.

Further, as shown in FIG. 1, the fingerprint recognition and pixel driving circuit further comprises a read line Y-Read. The fingerprint recognition sub-circuit 20 further comprises a second read terminal which is connected to the read line Y-Read. The fingerprint recognition sub-circuit 20 outputs the fingerprint data of the finger to the read line Y-Read through the second read terminal.

Moreover, the fingerprint recognition sub-circuit 20 may be further connected to a terminal through the read line Y-Read to output the fingerprint data of the finger to the terminal. The terminal can determine information about fingerprint ridges and valleys by acquiring the fingerprint data of the finger.

Figure 2:
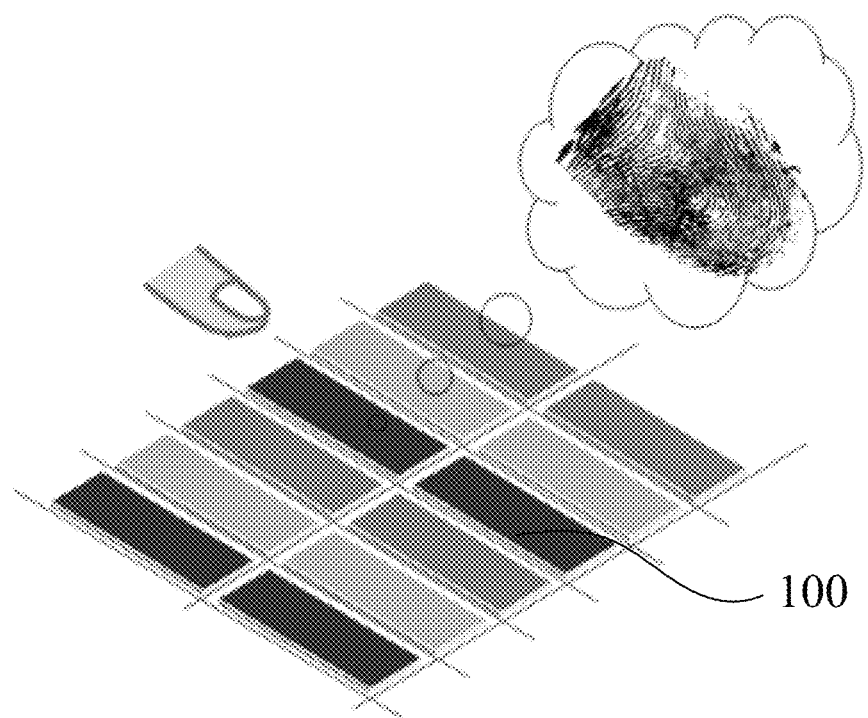
FIG. 2 is a schematic view illustrating fingerprint recognition by a fingerprint recognition and pixel driving circuit according to an embodiment of the disclosure.

For example, as shown in FIG. 2, when a user touches a screen 100 of the display device with a finger, the fingerprint recognition sub-circuit may generate fingerprint data of the finger based on the ridges and valleys of the fingerprint, and the fingerprint data of the finger is acquired by the terminal to determine fingerprint information.

That is, in the embodiment of the disclosure, the pixel driving sub-circuit 10 generates a light emitting current according to the first scan signal, the second scan signal, the third scan signal, the light emission control signal and the data signal to drive the light emitting element to emit light, thereby realizing a displaying function. Meanwhile, the fingerprint recognition sub-circuit 20 generates fingerprint data of the finger based on any two of the first scan signal, the second scan signal and the third scan signal, thereby realizing a fingerprint recognition function.

In this way, the scan lines of the pixel driving sub-circuit 10, the data signal lines for fingerprint recognition and the like are integrated together, and an efficient combination of multiple functions is realized. While the pixel driving sub-circuit 10 that drives displaying is being formed on the substrate of the display device, the fingerprint recognition sub-circuit 20 is further implanted into the pixel area to realize integration of the display function with the fingerprint recognition function.

Figure 3:
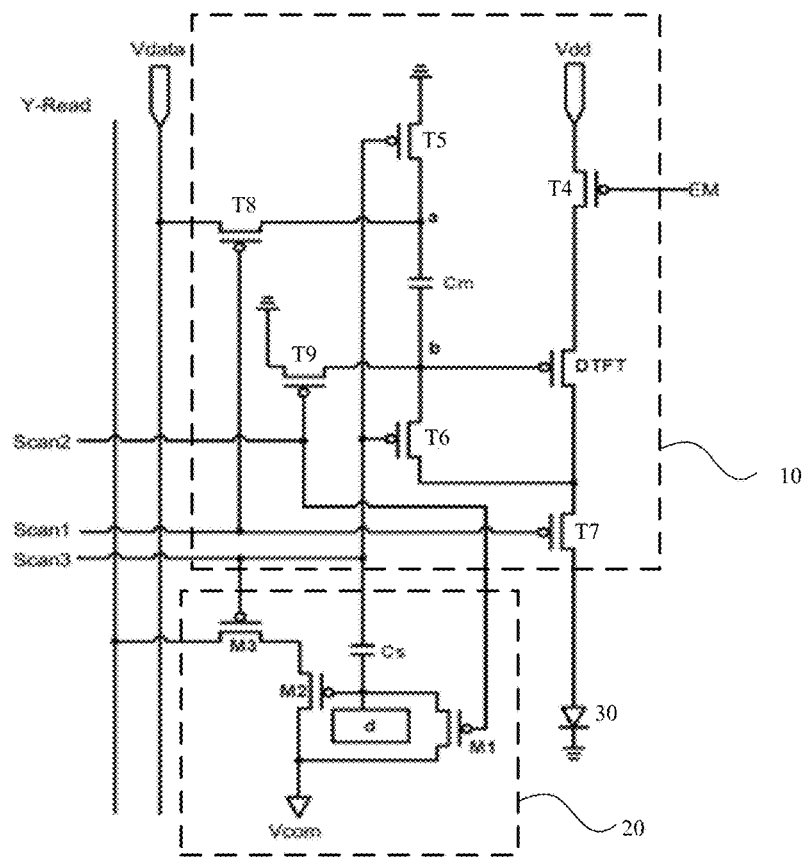
FIG. 3 is a schematic circuit diagram of a fingerprint recognition and pixel driving circuit according to an embodiment of the present disclosure.

According to a specific embodiment of the disclosure, as shown in FIG. 3, the fingerprint recognition sub-circuit 20 comprises a reset signal providing terminal Vcom for providing a reset signal, and a detection electrode d for forming a detection capacitance with a finger. The fingerprint recognition sub-circuit 20 resets the potential of the detection electrode with the reset signal of the reset signal providing terminal in response to receiving an active level signal from the reset terminal.

In an embodiment, the fingerprint recognition sub-circuit 20 further comprises a reference capacitor Cs, a first transistor M1, a second transistor M2, and a third transistor M3.

The reset signal providing terminal Vcom is configured to provide a reset signal, and the detection electrode d is configured to form a detection capacitance with a finger. One terminal of the reference capacitor Cs is connected to the detection electrode d and forms a first node. A control terminal of the first transistor M1 serves as a reset terminal of the fingerprint recognition sub-circuit 20, a first terminal of the first transistor M1 is connected to the reset signal providing terminal Vcom, and a second terminal of the first transistor M1 is connected to the first node. A control terminal of the second transistor is connected to the first node, and a first terminal of the second transistor is connected to the reset signal providing terminal Vcom. A control terminal of the third transistor M3 is connected to the other terminal of the reference capacitor Cs and forms a second node, a first terminal of the third transistor M3 is connected to the second terminal of the second transistor, a second terminal of the third transistor M3 serves as the second read terminal of the fingerprint recognition sub-circuit 20, and the second node serves as the first read terminal of the fingerprint recognition sub-circuit 20. Herein, the reset signal may be a signal comprising any appropriate voltage level, for example, it may have a ground voltage, or it may be a common voltage signal or the like in the circuit.

That is, the fingerprint recognition sub-circuit realizes the fingerprint recognition function. The fingerprint recognition sub-circuit comprises a first transistor M1, a second transistor M2, and a third transistor M3. The first transistor M1 is a signal reset transistor for resetting a signal. The second transistor is a signal amplification transistor for amplifying a signal, and the third transistor M3 is a switching transistor for controlling the fingerprint data of a finger to be outputted to the read line Y-Read. The fingerprint recognition sub-circuit further comprises the detection electrode d and the reference capacitor Cs, the detection electrode d is configured to form a detection capacitance with a finger, so that the fingerprint recognition sub-circuit determines information about ridges and valleys of the fingerprint according to a value of the detection capacitance, thereby acquiring the fingerprint data of the finger. Further, the fingerprint recognition sub-circuit further comprises the reset signal providing terminal Vcom which is connected to the first terminals of the first transistor M1 and the second transistor M2 to provide a reset signal.

Figure 4:
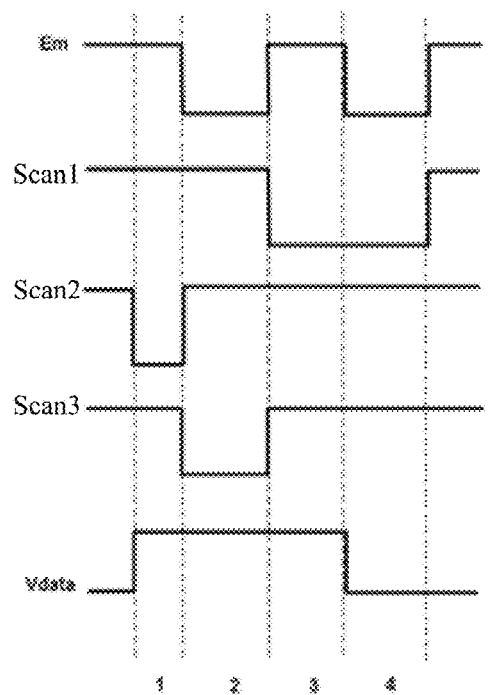
FIG. 4 is an operating timing diagram of a fingerprint recognition and pixel driving circuit according to an embodiment of the present disclosure.
Figure 16:
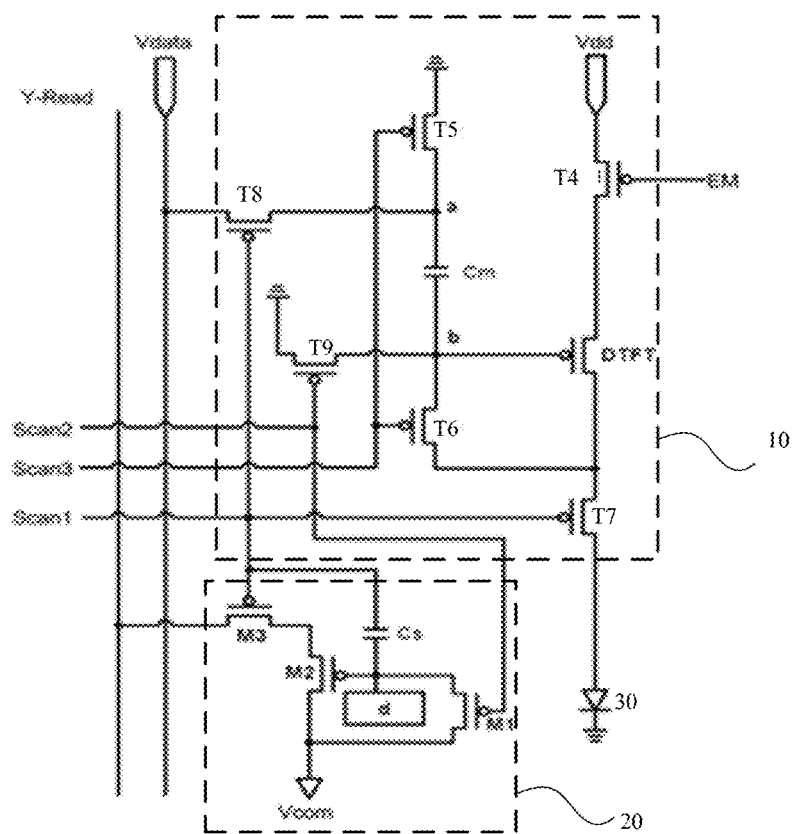
FIG. 16 is a schematic circuit diagram of a fingerprint recognition and pixel driving circuit according to another embodiment of the present disclosure.
Figure 17:
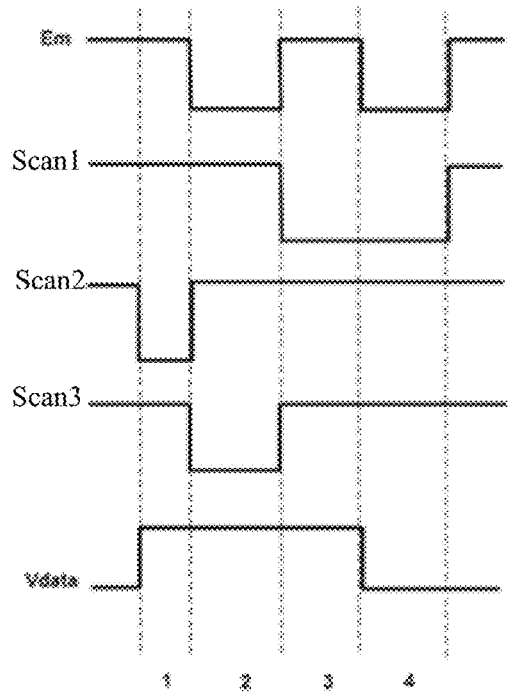
FIG. 17 is an operating timing diagram of a fingerprint recognition and pixel driving circuit according to another embodiment of the present disclosure.
Figure 18:
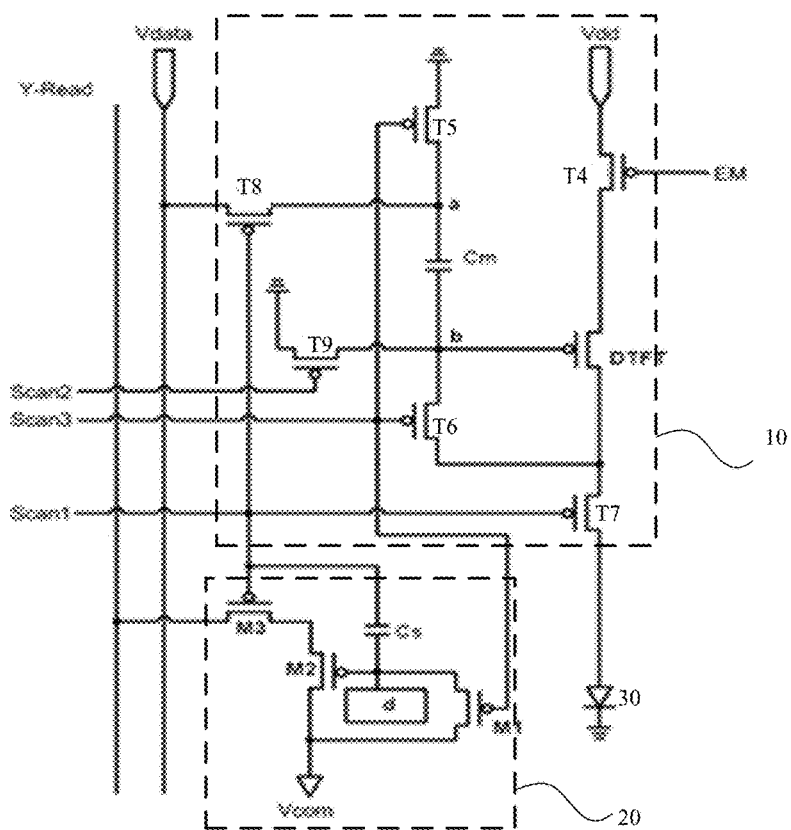
FIG. 18 is a schematic circuit diagram of a fingerprint recognition and pixel driving circuit according to a further embodiment of the present disclosure.
Figure 19:
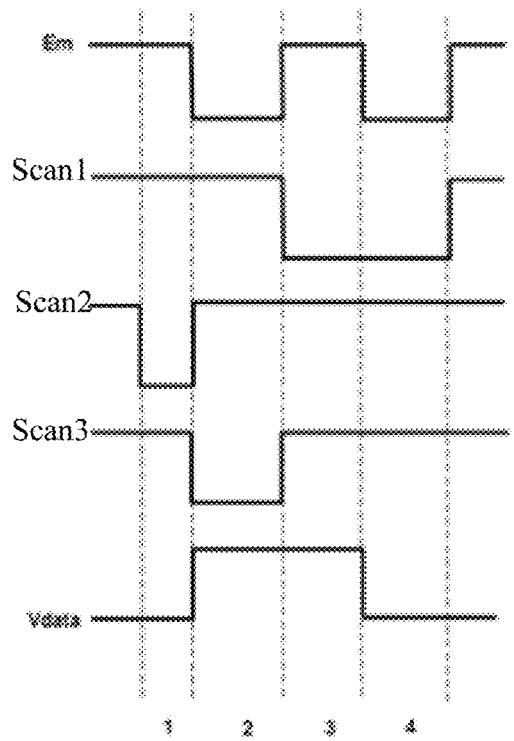
FIG. 19 is an operating timing diagram of a fingerprint recognition and pixel driving circuit according to a further embodiment of the present disclosure.

According to an embodiment of the disclosure, as shown in FIGS. 3 and 4, in case the first read terminal and the reset terminal of the fingerprint recognition sub-circuit 20 share the second scan line Scan2 and the third scan line Scan3 with the pixel driving sub-circuit 10, the first read terminal (i.e. the second node) of the fingerprint recognition sub-circuit 20 is connected to the third scan line Scan3, and the reset terminal of the fingerprint recognition sub-circuit 20 (i.e. the control terminal of the first transistor M1) is connected to the second scan line Scan2. In another example, as shown in FIGS. 16 and 17, if the first read terminal and the reset terminal of the fingerprint recognition sub-circuit 20 share the first scan line Scan1 and the second scan line Scan2 with the pixel driving sub-circuit 10, the first read terminal (i.e. the second node) of the fingerprint recognition sub-circuit 20 is connected to the first scan line Scan1, and the reset terminal of the fingerprint recognition sub-circuit 20 (i.e. the control terminal of the first transistor M1) is connected to the second scan line Scan2. In a further example, as shown in FIGS. 18 and 19, when the first read terminal and the reset terminal of the fingerprint recognition sub-circuit 20 share the first scan line Scan1 and the third scan line Scan3 with the pixel driving sub-circuit 10, the first read terminal (i.e. the second node) of the fingerprint recognition sub-circuit 20 is connected to the first scan line Scan1, and the reset terminal of the fingerprint recognition sub-circuit 20 (i.e. the control terminal of the first transistor M1) is connected to the third scan line Scan3.

According to a specific embodiment of the disclosure, as shown in FIG. 3, the pixel driving sub-circuit 10 comprises a driving transistor DTFT and a threshold voltage compensation circuit connected to the driving transistor. The threshold voltage compensation circuit is configured to compensate the voltage at the control terminal of the driving transistor to eliminate the influence of the threshold voltage of the driving transistor on the light emitting current when the light emitting element emits light.

In an embodiment of the disclosure, the threshold voltage compensation circuit comprises a storage capacitor Cm, a fifth transistor T5, a sixth transistor T6, an eighth transistor T8, and a ninth transistor T9. In the description below, the operating process of the threshold voltage compensation circuit will be described. In an embodiment of the disclosure, the pixel driving sub-circuit further comprises a fourth transistor T4 and a seventh transistor T7 so as to realize light emission control to the light emitting element.

A control terminal of the fourth transistor T4 serves as the light emission control terminal of the pixel driving sub-circuit 10, which is connected to the light emission control line Em. A first terminal of the fourth transistor T4 is configured to receive a power supply voltage Vdd, and a second terminal of the fourth transistor T4 is connected to a first terminal of the driving transistor DTFT. A terminal of the storage capacitor Cm is connected to a control terminal of the driving transistor DTFT and forms a third node b. A first terminal of the fifth transistor T5 is grounded, and a second terminal of the fifth transistor T5 is connected to the other terminal of the storage capacitor Cm and forms a fourth node a. A control terminal of the sixth transistor T6 is connected to the control terminal of the fifth transistor T5 and connected to the third scan line Scan3 as the third scan terminal of the pixel driving sub-circuit 10. A first terminal of the sixth transistor T6 is connected to the third node b, and a second terminal of the sixth transistor T6 is connected to the second terminal of the driving transistor DTFT. A first terminal of the seventh transistor T7 is connected to the second terminal of the driving transistor DTFT, and a second terminal of the seventh transistor T7 is connected to the light emitting element 30. A control terminal of the eighth transistor T8 is connected to the control terminal of the seventh transistor T7 and connected to the first scan line Scan1 as the first scan terminal of the pixel driving sub-circuit 10, the first terminal of the eighth transistor T8 serves as a data writing terminal of the pixel driving sub-circuit 10, which is connected to a data writing line Vdata, and a second terminal of the eighth transistor T8 is connected to the fourth node a. A control terminal of the ninth transistor T9 serves as the second scan terminal of the pixel driving sub-circuit 10 and is connected to the second scan line Scan2, a first terminal of the ninth transistor T9 is grounded, and a second terminal of the ninth transistor T9 is connected to the third node b.

That is, the pixel driving sub-circuit 10 comprises the storage capacitor Cm, the driving transistor DTFT, and the four transistor T4 to the ninth transistor T9. The four transistor T4 to the ninth transistor T9 are switching transistors. The pixel driving sub-circuit 10 drives the driving transistor DTFT to generate a light emitting current by controlling the fourth transistor T4 to the ninth transistor T9 to be turned on and off, so as to drive the light emitting element 30 to emit light. Moreover, the pixel driving sub-circuit 10 may also compensate the threshold voltage Vth of the driving transistor DTFT by controlling the fourth transistor T4 to the ninth transistor T9 to be turned on and off, thereby eliminating the adverse effect resulting from changes in the threshold voltage Vth by means of compensation.

As described above, for the entire fingerprint recognition and pixel driving circuit, the first scan line Scan1, the second scan line Scan2, the third scan line Scan3, and the light emission control line Em are input signal lines. These input signal lines are configured to control the switching transistors, i.e. the third transistor M3, the fourth transistor T4 to the ninth transistor T9, in the pixel driving sub-circuit 10 and the fingerprint recognition sub-circuit 20 to be turned on and off. In addition, on the basis of an example in which the first read terminal and the reset terminal of the fingerprint recognition sub-circuit 20 share the second scan line Scan2 and the third scan line Scan3 with the pixel driving sub-circuit 10, the third scan line Scan3 among the above input signal lines also serves as a line for confirming the X-scan direction of fingerprint recognition, and the second scan line Scan2 serves as a reset line for fingerprint recognition, besides inputting a switching signal to the pixel driving sub-circuit 10.

It is to be understood that a plurality of fingerprint recognition and pixel driving circuits correspond to a plurality of pixels. Each of the fingerprint recognition and pixel driving circuits is configured to drive the light emitting element 30 of a corresponding pixel to emit light, and recognize a fingerprint pressed on a corresponding pixel. Since the fingerprint of a finger is determined by means of the capacitance values involving the detection electrodes d to which N (N is an integer greater than 0) pixels correspond, the fingerprint recognition and pixel driving circuit may determine the position of a current pixel, i.e. the position of the recognized fingerprint, by the third scan line Scan3 and the second scan line Scan2 when fingerprint recognition is being performed. The X-direction coordinate for fingerprint recognition can be determined by the third scan line Scan3, and the Y-direction coordinate for fingerprint recognition can be determined by the read line Y-Read.

When the first read terminal and the reset terminal of the fingerprint recognition sub-circuit 20 share the first scan line Scan1 and the second scan line Scan2 with the pixel driving sub-circuit 10, the situation is similar to the above-described embodiment in which the third scan line Scan3 and the second scan line Scan2 are shared, except that the X-direction coordinate for fingerprint recognition can be determined by the first scan line Scan1. When the first read terminal and the reset terminal of the fingerprint recognition sub-circuit 20 share the first scan line Scan1 and the third scan line Scan3 with the pixel driving sub-circuit 10, the situation is similar to the above-described embodiment in which the third scan line Scan3 and the second scan line Scan2 are shared, except that the X-direction coordinate for fingerprint recognition can be determined by the first scan line Scan1.

In this way, the fingerprint recognition and pixel driving circuit can realize integration of the fingerprint recognition function with the display driving function by multiplexing signals, so that the fingerprint recognition function is implanted on the substrate of the display device, and convenient and efficient fingerprint recognition can be realized by touching the screen with a finger, thereby increasing the added value of the product.

The display substrate can be fabricated by a low temperature polysilicon (LTPS) process. While the pixel driving sub-circuit 10 comprising display driving function is being formed on the substrate, the fingerprint recognition sub-circuit 20 may be further integrated into the pixel area, thereby realizing integration of the display driving function with the fingerprint recognition function.

According to an embodiment of the disclosure, the first transistor M1, the second transistor, the third transistor M3, the driving transistor DTFT, the fourth transistor T4, the fifth transistor T5, the sixth transistor T6, the seventh transistor T7, the eighth transistor T8, and the ninth transistor T9 may all employ P-type thin film transistors (TFTs), that is, the transistors in the pixel driving sub-circuit 10 and the fingerprint recognition sub-circuit 20 may all be P-type TFTs, thereby simplifying the process.

According to an embodiment of the disclosure, as shown in FIGS. 3-19, the operating process of the fingerprint recognition sub-circuit 20 includes a fingerprint recognition reset phase and a fingerprint acquisition phase successively. In the fingerprint recognition reset phase, the second transistor M2 and the third transistor M3 are turned off, the first transistor M1 is turned on, and the reset signal resets the potential of the detection electrode d through the first transistor M1. In the fingerprint acquisition phase, the first transistor M1 is turned off, the second transistor M2 and the third transistor M3 are turned on, and the second transistor generates a corresponding drain current according to the value of the detection capacitance, and outputs the drain current through the third transistor M3.

According to an embodiment of the disclosure, as shown in FIGS. 3-19, the operating process of the pixel driving sub-circuit 10 includes a display reset phase 1, a display charging phase 2, a compensation transition phase 3, and a light emitting phase 4 successively. In the display reset phase 1, the first scan signal is at a low level, the second scan signal, the third scan signal, and the light emission control signal are at a high level, the fourth transistor T4 to the eighth transistor T8 are turned off, and the ninth transistor T9 is turned on to ground the storage capacitor Cm. During the display charging phase 2, the light emission control signal and the third scan signal are at a low level, the first scan signal and the second scan signal are at a high level, the seventh transistor T7 to the ninth transistor T9 are turned off, the four transistors T4 to the sixth transistor T6 are turned on, and the power supply charges the storage capacitor Cm through the fourth transistor T4, the driving transistor DTFT, and the sixth transistor T6. In the compensation transition phase 3, the first scan signal is at a low level, the light emission control signal, the second scan signal and the third scan signal are at a high level, the fourth transistor T4 to the sixth transistor T6 and the ninth transistor T9 are turned off, the seventh transistor T7 and the eighth transistor T8 are turned on, and the potential of the control terminal of the driving transistor DTFT varies according to the data signal. In the light emitting phase 4, the first scan signal and the light emission control signal are at a low level, the second scan signal and the third scan signal are at a high level, the fifth transistor T5, the sixth transistor T6 and the ninth transistor T9 are turned off, the fourth transistor T4, the seventh transistor T7 and the eighth transistor T8 are turned on, and the driving transistor DTFT generates a light emitting current according to the potential of the control terminal of the driving transistor DTFT, and provides the light emitting current to the light emitting element 30 through the seventh transistor T7 to make the light emitting element 30 emit light.

According to an embodiment of the disclosure, if the first read terminal of the fingerprint recognition sub-circuit 20 is connected to the third scan line Scan3, and the reset terminal thereof is connected to the second scan line Scan2, the fingerprint recognition reset phase of the fingerprint recognition sub-circuit 20 is performed simultaneously with the display reset phase 1 of the pixel driving sub-circuit 10, the fingerprint acquisition phase of the fingerprint recognition sub-circuit 20 is performed simultaneously with the display charging phase 2 of the pixel driving sub-circuit 10, and the fingerprint recognition sub-circuit 20 stops operating during the compensation transition phase 3 and the light emitting phase 4 of the pixel driving sub-circuit 10. When the first read terminal of the fingerprint recognition sub-circuit 20 is connected to the first scan line Scan1, and the reset terminal thereof is connected to the second scan line Scan2, the fingerprint recognition reset phase of the fingerprint recognition sub-circuit 20 is performed simultaneously with the display reset phase 1 of the pixel driving sub-circuit 10, the fingerprint acquisition phase of the fingerprint recognition sub-circuit 20 includes the compensation transition phase 3 and the light emitting phase 4 of the pixel driving sub-circuit 10, and the fingerprint recognition sub-circuit 20 stops operating during the display charging phase of the pixel driving sub-circuit 10. When the first read terminal of the fingerprint recognition sub-circuit 20 is connected to the first scan line Scan1, and the reset terminal thereof is connected to the third scan line Scan3, the fingerprint recognition reset phase of the fingerprint recognition sub-circuit 20 is performed simultaneously with the display charging phase 2 of the pixel driving sub-circuit 10, the fingerprint acquisition phase of the fingerprint recognition sub-circuit 20 includes the compensation transition phase 3 and the light emitting phase 4 of the pixel driving sub-circuit 10, and the fingerprint recognition sub-circuit 20 stops operating during the display reset phase 1 of the pixel driving sub-circuit 10.

The respective processes of the entire fingerprint recognition and pixel driving circuit according to an embodiment of the disclosure are described below one by one in conjunction with FIGS. 3-15 based on an example in which the first read terminal of the fingerprint recognition sub-circuit 20 is connected to the third scan line Scan3, and the reset terminal thereof is connected to the second scan line Scan2.

To facilitate understanding, the operating principles of the fingerprint recognition sub-circuit 20 and the pixel driving sub-circuit 10 will be described below separately, but actually the operating processes of the two sub-circuits are performed simultaneously. In addition, in this embodiment, the second scan line Scan2 serves as both a scan signal input line of the pixel driving circuit and a reset signal input line for fingerprint recognition, and the third scan line Scan3 serves as both a scan signal input line of the pixel driving circuit and a line for confirming a coordinate of X-scan direction for fingerprint recognition.

Figure 5:
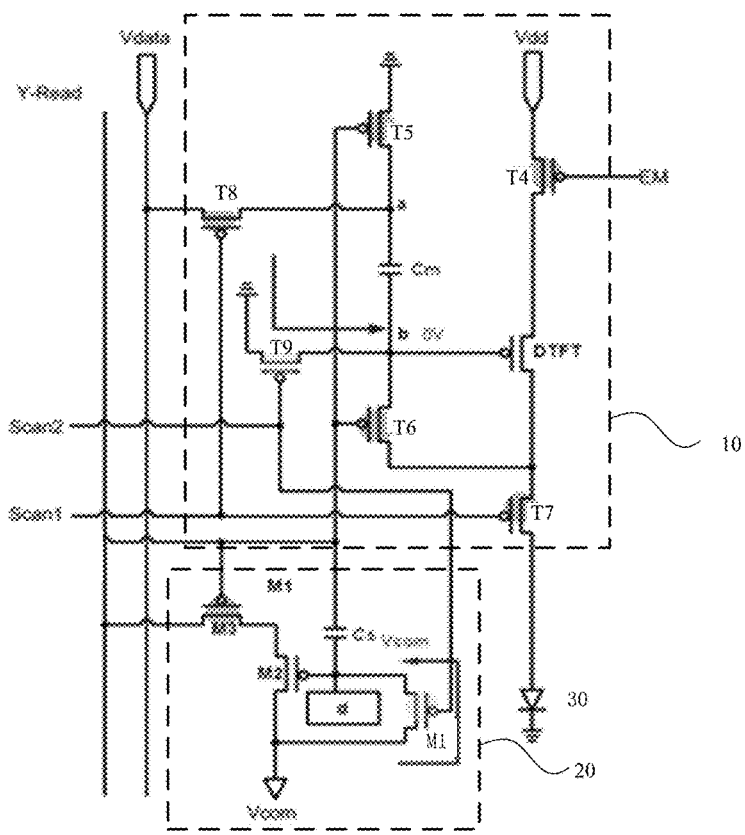
FIG. 5 is a schematic view illustrating an operating state of a fingerprint recognition and pixel driving circuit according to an embodiment of the present disclosure in a fingerprint recognition reset phase and a display reset phase.
Figure 6:
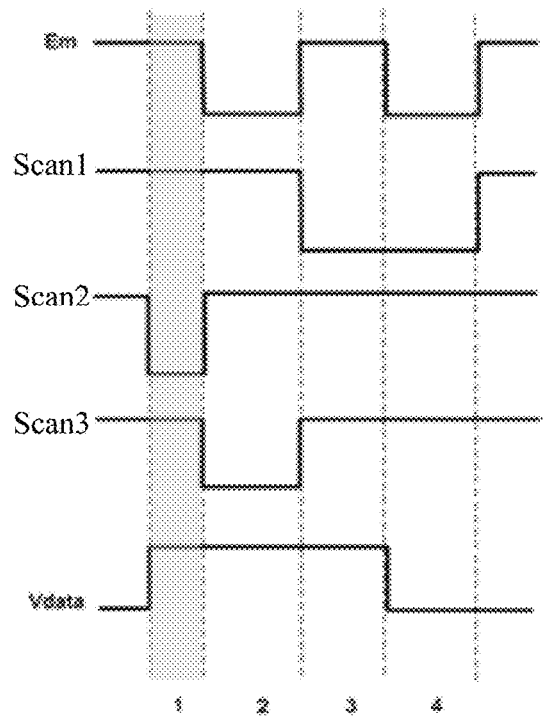
FIG. 6 is an operating timing diagram of a fingerprint recognition and pixel driving circuit according to an embodiment of the present disclosure in a fingerprint recognition reset phase and a display reset phase.

1) The operating principles of the fingerprint recognition reset phase and the display reset phase 1 are as follows. FIG. 5 is a schematic view of a conduction path which is shown by the arrows in the figure, and FIG. 6 is a signal timing diagram.

The operating process of the fingerprint recognition sub-circuit 20 is as follows. As shown in FIGS. 5 and 6, in this phase, the second scan signal outputted by the second scan line Scan2 is at a low level, and the low level is provided to the control terminal of the first transistor M1 so that the first transistor M1 is turned on. The reset signal providing terminal Vcom provides an initial reset signal so that the potential of the detection electrode d is the voltage of the reset signal, and at that time, the second transistor is in an OFF state as the turn-on condition is not satisfied. Further, the third scan signal outputted by the third scan line Scan3 is at a high level, and the third transistor M3 is also in an OFF state. Thus, the fingerprint recognition reset phase can prepare for the next fingerprint acquisition phase.

The operating process of the pixel driving sub-circuit 10 is as follows. As shown in FIGS. 5 and 6, in this phase, the light emission control signal outputted by the light emission control line Em is at a high level, the first scan signal outputted by the first scan line Scan1 is at a high level, the second scan signal outputted by the second scan line Scan2 is at a low level, and the third scan signal outputted by the third scan line Scan3 is at a high level, so that the ninth transistor T9 is turned on, and the fourth transistor T4 to the eighth transistor T8 are turned off. At that time, one terminal of the storage capacitor Cm, i.e. the third node b, is grounded, and the potential at point b is 0V.

Figure 7:
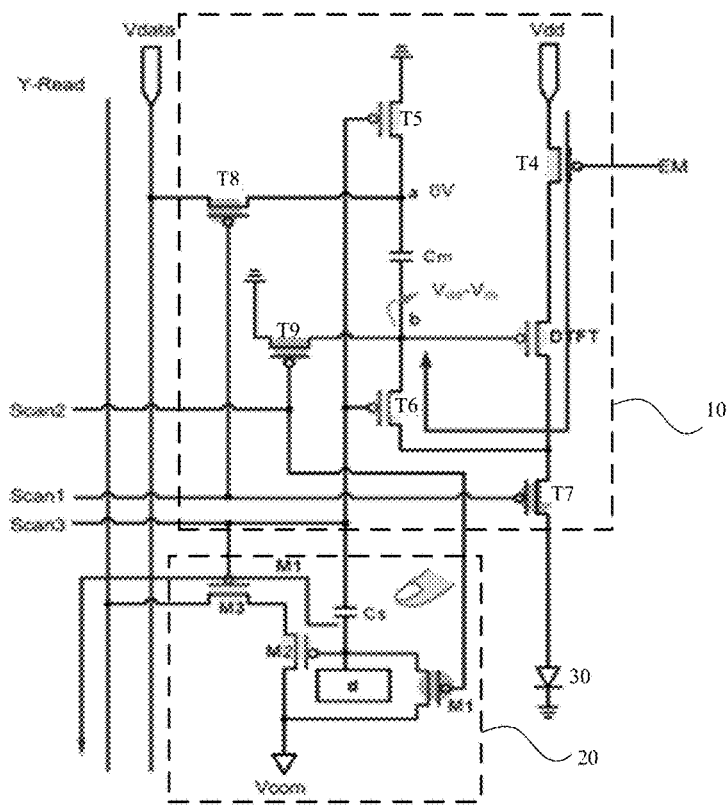
FIG. 7 is a schematic view illustrating an operating state of a fingerprint recognition and pixel driving circuit according to an embodiment of the present disclosure in a fingerprint acquisition phase and a display charging phase.
Figure 8:
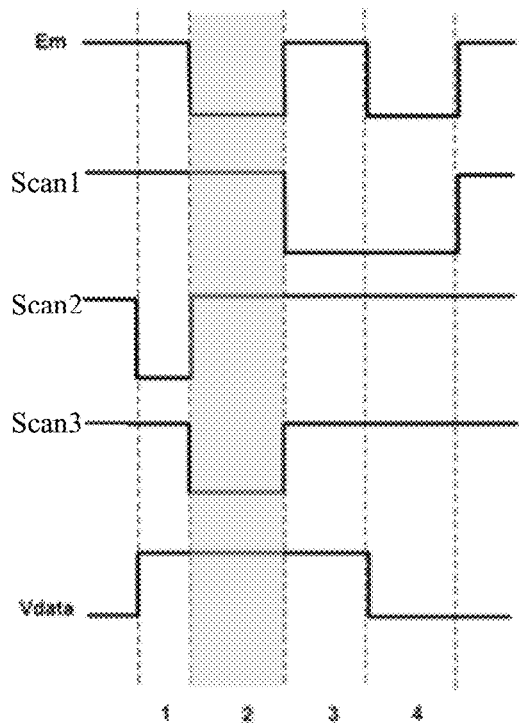
FIG. 8 is an operating timing diagram of a fingerprint recognition and pixel driving circuit according to an embodiment of the present disclosure in a fingerprint acquisition phase and a display charging phase.

2) The operating principles of the fingerprint acquisition phase and the display charging phase 2 are as follows. FIG. 7 is a schematic view of a conduction path which is shown by the arrows in the figure, and FIG. 8 is a signal timing diagram.

The operating process of the fingerprint recognition sub-circuit 20 is as follows. As shown in FIGS. 7 and 8, in this phase, the second scan signal outputted by the second scan line Scan2 is at a high level, the third scan signal outputted by the third scan line Scan3 is at a low level, the first transistor M1 is turned off, and the third transistor M3 is turned on.

Figure 9:
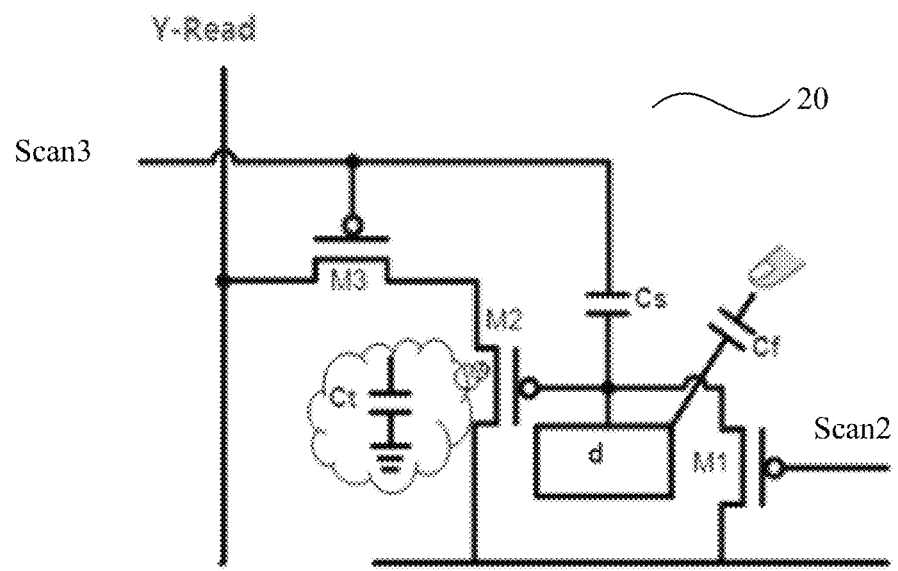
FIG. 9 is an operating principle diagram of a fingerprint recognition sub-circuit in a fingerprint recognition and pixel driving circuit according to an embodiment of the present disclosure.

As shown in FIG. 9, the fingerprint recognition sub-circuit 20 further comprises, in addition to the reference capacitor Cs, a detection capacitance Cf formed by a finger and the detection electrode d, and the second transistor itself also has a parasitic capacitor Ct. When a finger touches the screen, the detection electrode d of a touched pixel forms a detection capacitance Cf with the finger above the touched pixel, and the potential of the control terminal, i.e. the gate, of the second transistor, varies depending on the magnitude of the detection capacitance Cf. The larger the detection capacitance Cf is, the smaller the gate potential of the second transistor will be. On the contrary, the smaller the detection capacitance Cf is, the larger the gate potential of the second transistor will be, which causes the drain current of the second transistor to change. In this way, ridge and valley information of the fingerprint can be determined according to the drain current of the second transistor. At that time, the drain current of the second transistor flows through the third transistor M3 and is transmitted to a receiving component of the terminal through the read line Y-Read.

Figure 10:
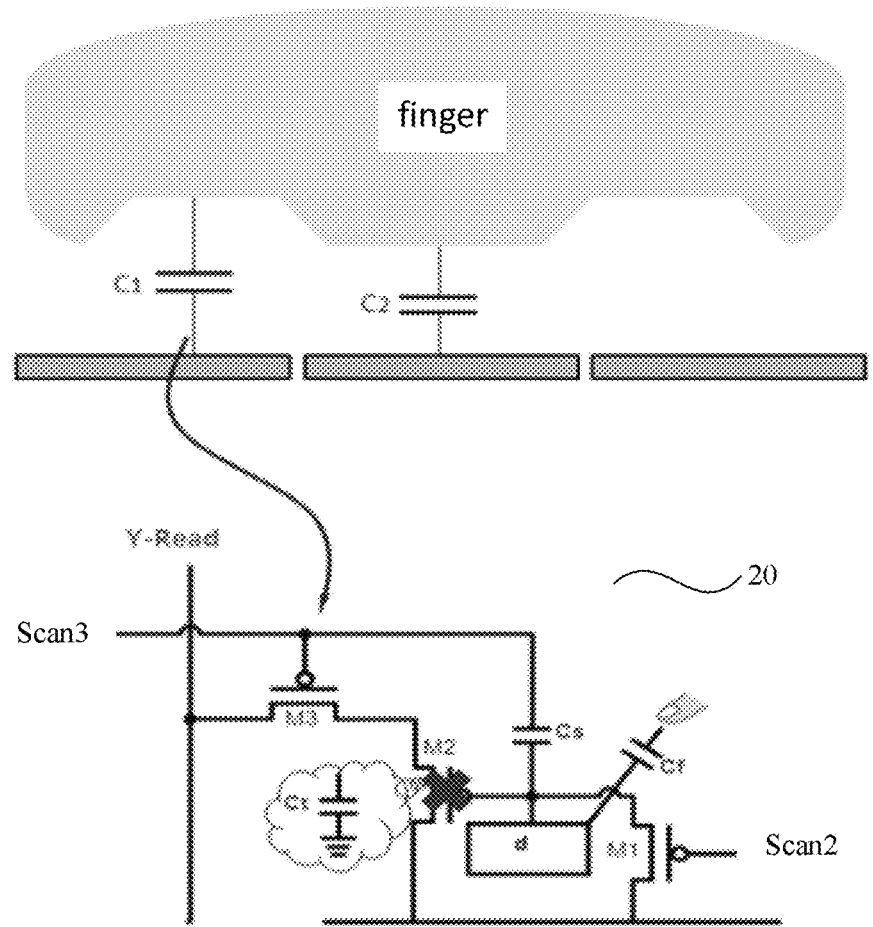
FIG. 10 is an operating diagram illustrating that a fingerprint recognition sub-circuit in a fingerprint recognition and pixel driving circuit according to an embodiment of the disclosure recognizes fingerprint valleys.

As shown in FIG. 10, when a valley portion of the finger is above the detection electrode d of a pixel, the detection capacitance Cf formed by the valley portion and the detection electrode d has a value C1 (a relatively small capacitance), which is sufficiently small relative to the reference capacitor Cs and the parasitic capacitor Ct. At that time, the gate potential of the second transistor increases, so that the second transistor is in an approximately OFF state, the read line Y-Read acquires an initial drain current signal, and the terminal determines that what is above the pixel is a valley portion of the fingerprint.

Figure 11:
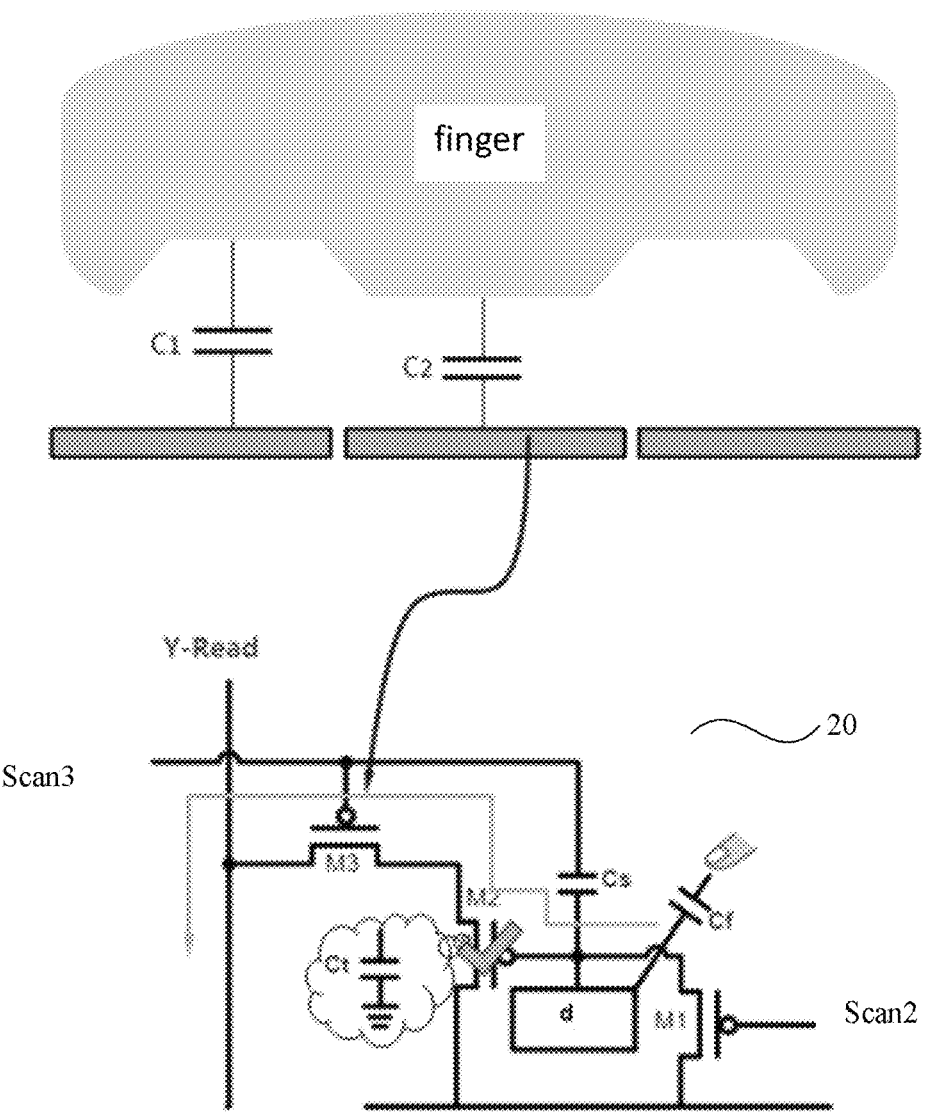
FIG. 11 is an operating principle diagram illustrating that a fingerprint recognition sub-circuit in a fingerprint recognition and pixel driving circuit according to an embodiment of the disclosure recognizes fingerprint ridges.

Similarly, as shown in FIG. 11, when a ridge portion of the finger is above the detection electrode d of the pixel, the detection capacitance Cf formed by the ridge portion and the detection electrode d has a value C2 (a relatively large value, C2 is larger than C1), which is sufficiently large relative to the reference capacitor Cs and the parasitic capacitor Ct. At that time, the gate potential of the second transistor decreases, so that the second transistor is in an amplified state, the read line Y-Read acquires an amplified drain current signal, and the terminal determines that what is above the pixel is a ridge portion of the fingerprint.

The operating process of the pixel driving sub-circuit 10 is as follows. As shown in FIGS. 7 and 8, in this phase, the light emission control signal outputted by the light emission control line Em is at a low level, the first scan signal outputted by the first scan line Scan1 is at a high level, the second scan signal outputted by the second scan line Scan2 is at a high level, and the third scan signal outputted by the third scan line Scan3 is at a low level, so that the fourth transistor T4, the fifth transistor T5, and the sixth transistor T6 are turned on, while the seventh transistor T7, the eighth transistor T8, and the ninth transistor T9 are turned off. At that time, one terminal of the storage capacitor Cm, i.e. the third node b, is grounded, so the driving transistor DTFT is turned on, and the voltage signal Vdd provided by the power supply Vdd starts to charge the node b through the fourth transistor T4, the driving transistor DTFT and the sixth transistor T6 until the node b is charged to (Vdd+Vth) (Vth is the threshold voltage of the driving transistor DTFT, and Vth is a negative value for a P-type transistor). In this process, since the other terminal of the storage capacitor Cm, i.e. the fourth node a, is grounded, and the potential at the node a is always 0, when the charging is finished, the potential at the node b will be maintained at (Vdd+Vth). In addition, since the seventh transistor T7 is turned off so that no current would pass through the light emitting element 30 such as an organic light emitting diode OLED, thereby indirectly reducing the lifetime loss of the OLED.

Figure 12:
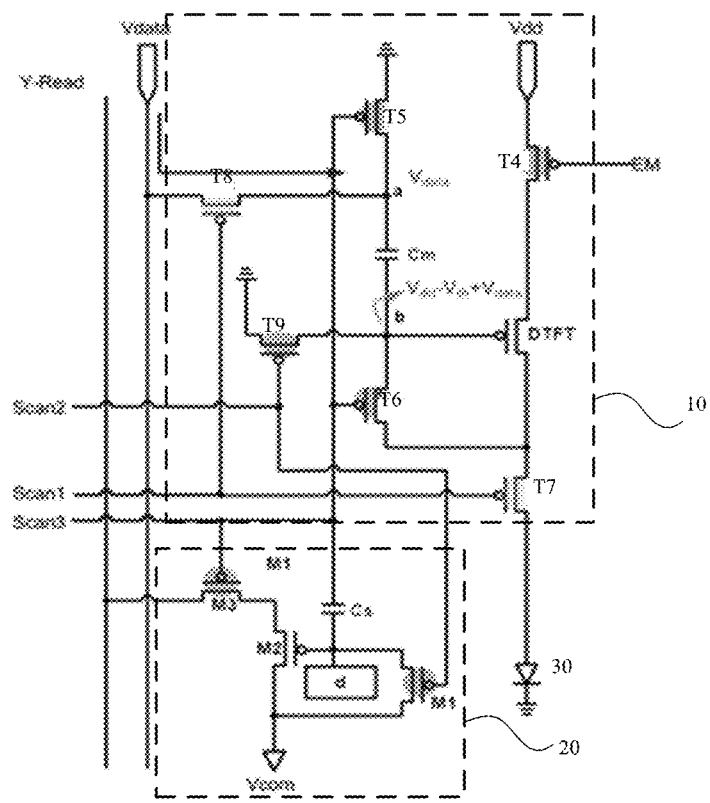
FIG. 12 is a schematic view illustrating an operating state of a fingerprint recognition and pixel driving circuit according to an embodiment of the present disclosure in a fingerprint stagnation phase and a compensation transition phase.
Figure 13:
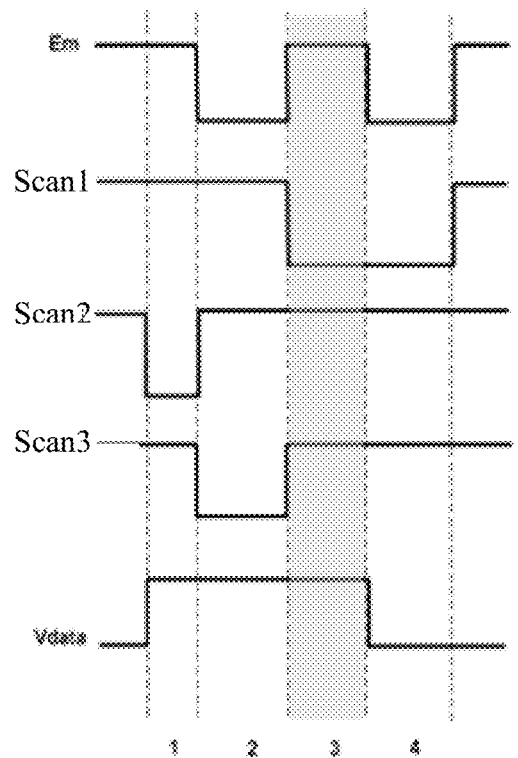
FIG. 13 is an operating timing diagram of a fingerprint recognition and pixel driving circuit according to an embodiment of the present disclosure in a fingerprint stagnation phase and a compensation transition phase.

3) The operating processes of the fingerprint stagnation phase and the compensation transition phase 3 are as follows. FIG. 12 is a schematic view of a conduction path which is as shown by the arrows in the figure, and FIG. 13 is a signal timing diagram.

The operating process of the fingerprint recognition sub-circuit 20 is as follows. As shown in FIGS. 12 and 13, in this phase, the fingerprint recognition sub-circuit 20 is in a stagnation phase, the first transistor M1 and the third transistor M3 are turned off, and all devices of the fingerprint recognition sub-circuit 20 do not operate, thus minimizing the impact on the pixel driving process.

The operating process of the pixel driving sub-circuit 10 is as follows. The light emission control signal outputted by the light emission control line Em is at a high level, the first scan signal outputted by the first scan line Scan1 is a low level, the second scan signal outputted by the second scan line Scan2 is at a high level, the third scan signal outputted by the third scan line Scan3 is at a high level, so that the seventh transistor T7 and the eighth transistor T8 are turned on, while the fourth transistor T4, the fifth transistor T5, the sixth transistor T6, and the ninth transistor T9 are turned off.

At that time, since the eighth transistor T8 is turned on, the data signal Vdata provided by the data writing line is provided to the node a through the eighth transistor T8. The potential at the node a changes from the original 0V to Vdata, and the node b is in a floating state. Therefore, to maintain the original voltage difference (Vdd+Vth) between the nodes a and b, the potential at the node b would transition to Vdd+Vth+Vdata and remain unchanged, preparing for the next phase.

Figure 14:
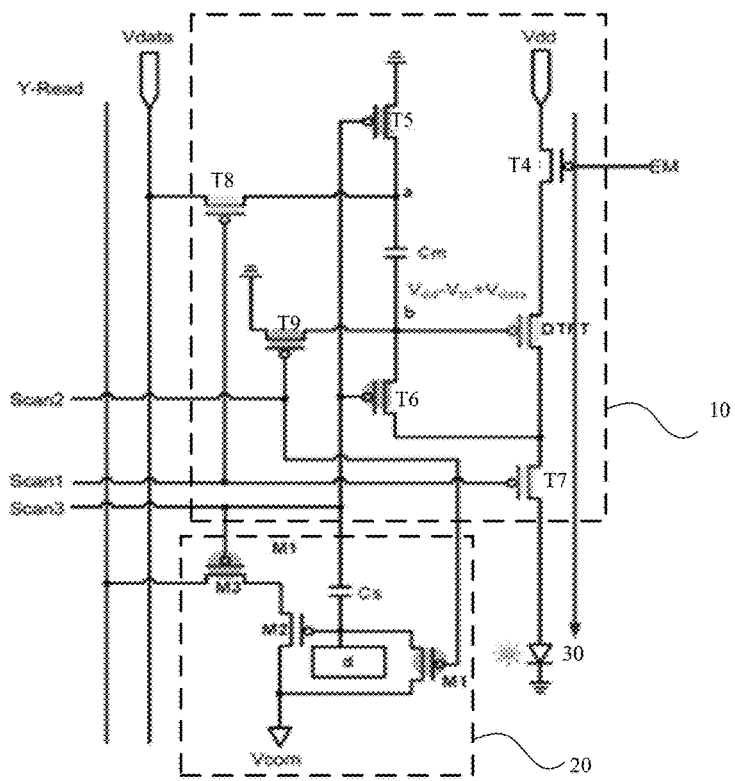
FIG. 14 is a schematic view illustrating an operating state of a fingerprint recognition and pixel driving circuit according to an embodiment of the present disclosure in a fingerprint recognition reset phase and a display reset phase.
Figure 15:
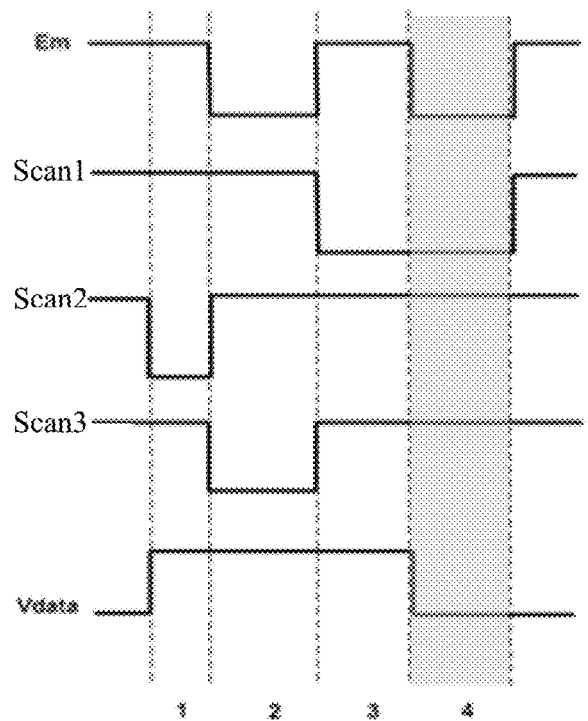
FIG. 15 is an operating timing diagram of a fingerprint recognition and pixel driving circuit according to an embodiment of the present disclosure in a fingerprint stagnation phase and a light emitting phase.

4) The operating process of the fingerprint stagnation phase and the light emitting phase 4 is as follows. FIG. 14 is a schematic view of a conduction path which is as shown by the arrows in the figure, and FIG. 15 is a signal timing diagram.

The operating process of the fingerprint recognition sub-circuit 20 is as follows. As shown in FIGS. 14 and 15, in this phase, the fingerprint recognition sub-circuit 20 is in a stagnation phase, the first transistor M1 and the third transistor M3 are turned off, and all devices of the fingerprint recognition sub-circuit 20 do not operate, thus minimizing the impact on image display.

The operating process of the pixel driving sub-circuit 10 is as follows. In this phase, the light emission control signal outputted by the light emission control line Em is at a low level, the first scan signal outputted by the first scan line Scan1 is at a low level, the second scan signal outputted by the second scan line Scan2 is at a high level, and the third scan signal outputted by the third scan line Scan3 is at a high level, so that the fourth transistor T4, the seventh transistor T7, and the eighth transistor T8 are turned on, while the fifth transistor T5, the sixth transistor T6 and the ninth transistor T9 are turned off. At that time, the source of the driving transistor DTFT is supplied with the power supply Vdd, and a current is generated and passes through the fourth transistor T4, the driving transistor DTFT and the seventh transistor T7 to make the OLED emit light.

According to the saturation current calculation for the driving transistor DTFT, the following equation can be obtained:

$$I_{OLED} = K(V_{GS} - Vth)^2 = K[(Vdd + Vth + V\text{data}) - Vdd - Vth]^2 = K(V\text{data})^2$$

wherein $I_{OLED}$ is the light emitting current generated by the driving transistor DTFT, K is a constant related to process and design for the driving transistor, $V_{GS}$ is the voltage between the gate and the source of the driving transistor DTFT, Vth is the threshold voltage of the driving transistor DTFT, Vdd is the power supply voltage, and Vdata is the voltage of the data signal.

It can be seen from the above equation that the light emitting current IOLED could not affected by the threshold voltage Vth and is only related to Vdata, which solves the problem that the threshold voltage (Vth) of the driving transistor DTFT drifts due to the process procedures and long-time operation, so that its influence on the light emitting current $I_{OLED}$ is eliminated, thereby ensuring normal operation of the light emitting element 30.

In the above embodiments, it is ensured that no current passes through the light emitting element 30 except for the light emitting phase, thereby prolonging the lifetime of the light emitting element 30.

In addition, in other embodiments of the disclosure, in the case of ensuring that the pixel driving sub-circuit 10 performs display driving normally, the fingerprint recognition sub-circuit may carry out the fingerprint recognition function by utilizing other scan lines of other pixel driving sub-circuits.

The embodiment according to FIGS. 16 and 17 is substantially identical to the embodiment of FIGS. 3 and 4, except that in the embodiment of FIGS. 16 and 17, the first read terminal of the fingerprint recognition sub-circuit 20 is connected to the first scan line Scan1, and the reset terminal of the fingerprint recognition sub-circuit 20 is connected to the second scan line Scan2. In this case, the second scan line Scan2 serves as both a control signal input line of the pixel driving circuit and a reset line for fingerprint recognition, and the first scan line Scan1 serves as both a control signal input line of the pixel driving circuit and a line for confirming the coordinate of X-scan direction of fingerprint recognition. Thus, in the case of ensuring that the pixel driving sub-circuit 10 performs display driving normally, the fingerprint recognition reset phase of the fingerprint recognition sub-circuit 20 is performed simultaneously with the display reset phase of the pixel driving sub-circuit 10, and the fingerprint acquisition phase of the fingerprint recognition sub-circuit 20 is performed simultaneously with the compensation transition phase of the pixel driving sub-circuit 10.

The embodiment according to FIGS. 18 and 19 is substantially identical to the embodiment of FIGS. 3 and 4, except that in the embodiment of FIGS. 18 and 19, the first read terminal of the fingerprint recognition sub-circuit 20 is connected to the first scan line Scan1, and the reset terminal of the fingerprint recognition sub-circuit 20 is connected to the third scan line Scan3. In this case, the third scan line Scan3 serves as both a control signal input line of the pixel driving circuit and a reset line for fingerprint recognition, and the first scan line Scan1 serves as both a control signal input line of the pixel driving circuit and a line for confirming the coordinate of X-scan direction of fingerprint recognition. Thus, in the case of ensuring that the pixel driving sub-circuit 10 performs display driving normally, the fingerprint recognition reset phase of the fingerprint recognition sub-circuit 20 is performed simultaneously with the display charging phase of the pixel driving sub-circuit 10, and the fingerprint acquisition phase of the fingerprint recognition sub-circuit 20 is performed simultaneously with the compensation transition phase of the pixel driving sub-circuit 10.

In summary, for the fingerprint recognition and pixel driving circuits proposed by the embodiments of the disclosure, the first read terminal and the reset terminal of the fingerprint recognition sub-circuit share any two of the first scan line, the second scan line, and the third scan line with the pixel driving sub-circuit, the pixel driving sub-circuit drives the light emitting element of a pixel to emit light according to the first scan signal, the second scan signal, the third scan signal, the light emission control signal and the data signal, and the fingerprint recognition sub-circuit recognizes the fingerprint of a finger based on any two of the first scan signal, the second scan signal and the third scan signal so as to generate fingerprint data of the finger. Thus, the circuits according to the embodiments of the disclosure realize integration of the fingerprint recognition function with the pixel driving function. While the pixel driving sub-circuit comprising display driving function is formed on the substrate of the display device, the fingerprint recognition sub-circuit is further implanted into the pixel so as to realize integration of the display driving function with the fingerprint recognition function, so that the fingerprint recognition function is implanted inside the screen of the display device, thereby achieving efficient integration of multiple functions and increasing the added value of the product.

Further, in the fingerprint recognition sub-circuit according to the above-described embodiments and drawings, the reference capacitor Cs is illustrated, but in other embodiments, the reference capacitor Cs may also be omitted. The present disclosure does not limit the specific circuit configuration of the fingerprint recognition sub-circuit.

An embodiment of the present disclosure further provides a display device comprising the fingerprint recognition and pixel driving circuits described in the foregoing embodiments, the fingerprint recognition and pixel driving circuit comprising a pixel driving sub-circuit and a fingerprint recognition sub-circuit. It is to be understood that applying the above-described fingerprint recognition and pixel driving circuit to a display device enables the display device to have a fingerprint recognition function.

According to an embodiment of the disclosure, the fingerprint recognition and pixel driving circuits are distributed in the display device at intervals. More specifically, the fingerprint recognition and pixel driving circuits may be periodically distributed in the display device at intervals. That is, while the pixel driving sub-circuit comprising display driving function is formed on the substrate, the fingerprint recognition sub-circuits may be further implanted.

Figure 20:
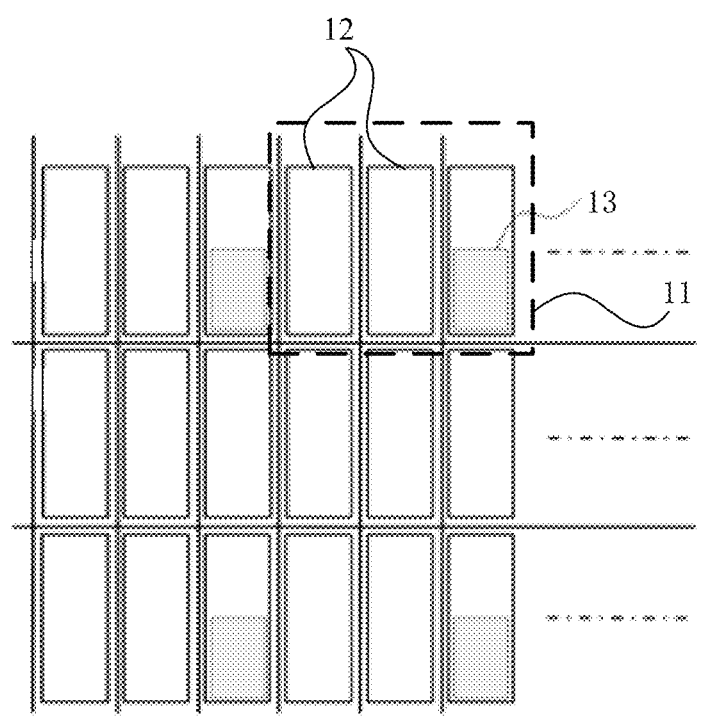
FIG. 20 is a schematic view showing an arrangement of fingerprint recognition and pixel driving circuits in a display device according to an embodiment of the disclosure.

According to an embodiment of the disclosure, the fingerprint recognition sub-circuits may be distributed periodically in the display device based on the design parameters such as size or PPI (Pixels Per Inch) of the screen of the display device. For example, in FIG. 20, a pixel arrangement of 3 rows and 2 columns is shown. That is, every three pixels constitute a pixel unit 11, and each pixel unit 11 may be provided with two pixel driving circuits 12 and one fingerprint recognition and pixel driving circuit 13. The pixel driving circuit 12 can only have the display driving function but cannot achieve the fingerprint recognition function. The fingerprint recognition and pixel driving circuit 13 can realize integration of the fingerprint recognition function with the display driving function. In addition, other possible pixel arrangements are not excluded herein.

According to an embodiment of the present disclosure, the display device may be an organic light emitting display such as an AMOLED display.

In summary, the display device proposed by the embodiment of the disclosure realizes integration of the fingerprint recognition function with the pixel driving function, so that the fingerprint recognition function is implanted inside the screen of the display device, which subverts the combination of simply accumulating different elements in the related art, achieves efficient integration of multiple functions, and increases the added value of the product.

In the description, it is to be understood that the orientation or positional relationship indicated by the terms "center", "longitudinal", "lateral", "length", "width", "thickness", "above", "below", "front", "back", "left", "right", "vertical", "horizontal", "top", "bottom", "inside", "outside", "clockwise", "counterclockwise", "axial", "radial", "circumferential" or the like is based on the orientation or positional relationship illustrated in the drawings, which is merely for the convenience of describing the disclosure and simplifying the description, rather than indicating or implying that the device or component referred to must have a particular orientation or be constructed and operated in the particular orientation, thus all the terms cannot be construed as limitation to the disclosure.

Moreover, the terms "first" and "second" are used for descriptive purposes only and are not to be construed as indicating or implying a relative importance or implicitly indicating the number of technical features indicated. Thus, a feature defined with "first" or "second" may explicitly or implicitly indicates that at least one such feature is present. As used herein, "multiple" means at least two, such as two, three, etc., unless specifically defined otherwise.

In the present description, unless specified and defined otherwise, the terms "install", "link", "connect", "fix" and the like shall be understood in a broad sense, which may indicate, for example, a fixed connection, a detachable connection, or an integration; a mechanical connection or an electrical connection; a direct linking or an indirect linking via an intermediate medium; or an internal communication between two components or an interaction between two components, unless defined otherwise. For those ordinarily skilled in the art, the specific meanings of the above terms in the disclosure may be understood depending on specific situations.

In the present description, the first feature being "above" or "below" the second feature may indicate that the first feature is in direct contact with the second feature, or the first feature is in indirect contact with the second feature via an intermediate medium, unless specified and defined otherwise. Moreover, the first feature being "over", "above" and "on" the second feature may indicate that the first feature is directly above or above the second feature, or merely indicate that the horizontal position of the first feature is higher than that of the second feature. The first feature being "below", "under" and "beneath" the second feature may indicate that the first feature is directly below or below the second feature, or merely indicate that the horizontal position of the first feature is lower than that of the second feature.

In this specification, description with reference to the terms "an embodiment", "some embodiments", "example", "specific embodiment", "some examples" and the like means that specific features, structures, materials or characteristics described in conjunction with the embodiments or examples are included in at least one embodiment or example of the present disclosure. In the present specification, expressions related to the above terms are not necessarily directed to the same embodiment or example. Furthermore, the specific features, structures, materials, or characteristics described may be combined in a suitable manner in any one or more embodiments or examples. In addition, in case of no conflict or contradiction, various embodiments or examples described in the specification, as well as features of various embodiments or examples, may be combined.

While embodiments of the disclosure have been shown and described above, it can be understood that the above-described embodiments are illustrative and are not to be construed as limiting the present disclosure. Variations, amendments, substitutions and modifications may be made to the above-described embodiments without departing the scope of the disclosure.

The invention claimed is:

1. A fingerprint recognition and pixel driving circuit comprising:
   a first scan line, a second scan line, a third scan line, a light emission control line, and a data writing line;
   a pixel driving sub-circuit, the pixel driving sub-circuit comprising a first scan terminal, a second scan terminal, a third scan terminal, a light emission control terminal, and a data writing terminal, wherein the first scan terminal of the pixel driving sub-circuit is electrically connected to the first scan line and configured to receive a first scan signal, the second scan terminal of the pixel driving sub-circuit is electrically connected to the second scan line and configured to receive a second scan signal, the third scan terminal of the pixel driving sub-circuit is electrically connected to the third scan line and configured to receive a third scan signal, the light emission control terminal of the pixel driving sub-circuit is electrically connected to the light emission control line and configured to receive a light emission control signal, and the data writing terminal of the pixel driving sub-circuit is electrically connected to the data writing line and configured to receive a data signal, wherein the pixel driving sub-circuit drives a light emitting element of a pixel to emit light according to the first scan signal, the second scan signal, the third scan signal, the light emission control signal and the data signal;

a fingerprint recognition sub-circuit, the fingerprint recognition sub-circuit comprising a first read terminal and a reset terminal, wherein the first read terminal and the reset terminal are electrically connected to two of the first scan line, the second scan line and the third scan line, respectively, to generate fingerprint data based on two of the first scan signal, the second scan signal and the third scan signal; and a driving transistor configured to drive the light emitting element of the pixel to emit light, wherein the fingerprint recognition and pixel driving circuit further comprises a read line, wherein the fingerprint recognition sub-circuit further comprises a second read terminal electrically connected to the read line, and wherein the fingerprint recognition sub-circuit outputs the fingerprint data to the read line through the second read terminal, wherein the fingerprint recognition sub-circuit comprises a reset signal providing terminal configured to provide a reset signal, and a detection electrode configured to form a detection capacitance with a finger, and wherein the fingerprint recognition sub-circuit is configured to reset a potential of the detection electrode with the reset signal from the reset signal providing terminal in response to receiving an effective level signal from the reset terminal, wherein the fingerprint recognition sub-circuit further comprises:
  a reference capacitor, wherein a first terminal of the reference capacitor is electrically connected to the detection electrode to form a first node with the detection electrode;
  a first transistor, wherein a control terminal of the first transistor is configured to serve as the reset terminal of the fingerprint recognition sub-circuit, wherein a first terminal of the first transistor is electrically connected to the reset signal providing terminal, and a second terminal of the first transistor is electrically connected to the first node;
  a second transistor, wherein a control terminal of the second transistor is electrically connected to the first node, and wherein a first terminal of the second transistor is electrically connected to the reset signal providing terminal; and
  a third transistor, wherein a control terminal of the third transistor is electrically connected to a second terminal of the reference capacitor to form a second node with the reference capacitor, wherein a first terminal of the third transistor is electrically connected to a second terminal of the second transistor, wherein a second terminal of the third transistor is configured to serve as the second read terminal of the fingerprint recognition sub-circuit, and wherein the second node is configured to serve as the first read terminal of the fingerprint recognition sub-circuit, wherein an operating process of the fingerprint recognition sub-circuit comprises a fingerprint recognition reset phase and a fingerprint acquisition phase successively, wherein in the fingerprint recognition reset phase, the second transistor and the third transistor are turned off, the first transistor is turned on, and the reset signal resets the potential of the detection electrode by means of the first transistor;

in the fingerprint acquisition phase, the first transistor is turned off, and the second transistor generates a drain current according to a value of the detection capacitance, and the second transistor is configured to output the drain current through the third transistor, wherein the driving transistor and the first transistor to a ninth transistor comprise P-type transistors, wherein an operating process of the pixel driving sub-circuit comprises a display reset phase, a display charging phase, a compensation transition phase, and a light emitting phase successively, wherein, in the display reset phase, the second scan signal is at a low level, the first scan signal, the third scan signal, and the light emission control signal are at a high level, a fourth transistor to an eighth transistor are turned off, and the ninth transistor is turned on to reset a storage capacitor;

wherein in the display charging phase, the light emission control signal and the third scan signal are at a low level, the first scan signal and the second scan signal are at a high level, a seventh transistor, the eighth transistor and the ninth transistor are turned off, the fourth transistor, a fifth transistor, a sixth transistor and the driving transistor are turned on, and a power supply voltage charges the storage capacitor through the fourth transistor, the driving transistor, and the sixth transistor;

wherein in the compensation transition phase, the first scan signal is at a low level, the light emission control signal, the second scan signal, and the third scan signal are at a high level, the fourth transistor, the fifth transistor, the sixth transistor and the ninth transistor are turned off, the seventh transistor and the eighth transistor are turned on, and a potential of the control terminal of the driving transistor varies according to the data signal; and wherein in the light emitting phase, the first scan signal and the light emission control signal are at a low level, the second scan signal and the third scan signal are at a high level, the fifth transistor, the sixth transistor and the ninth transistor are turned off, the fourth transistor, the seventh transistor and the eighth transistor are turned on, and the driving transistor generates the light emitting current according to the potential of the control terminal of the driving transistor, and provides the light emitting current to the light emitting element through the seventh transistor to make the light emitting element emit light.

2. The fingerprint recognition and pixel driving circuit according to claim 1, wherein the first read terminal of the fingerprint recognition sub-circuit is electrically connected to the third scan line, and the reset terminal of the fingerprint recognition sub-circuit is electrically connected to the second scan line.

3. The fingerprint recognition and pixel driving circuit according to claim 1, wherein the first read terminal of the fingerprint recognition sub-circuit is electrically connected to the first scan line, and the reset terminal of the fingerprint recognition sub-circuit is electrically connected to the second scan line.

4. The fingerprint recognition and pixel driving circuit according to claim 1, wherein the first read terminal of the fingerprint recognition sub-circuit is electrically connected to the first scan line, and wherein the reset terminal of the fingerprint recognition sub-circuit is electrically connected to the third scan line.

5. The fingerprint recognition and pixel driving circuit according to claim 1, wherein the pixel driving sub-circuit comprises:
a driving transistor configured to drive the light emitting element of the pixel to emit light; and
a threshold voltage compensation circuit electrically connected to the driving transistor, and is configured to compensate a voltage of a control terminal of the driving transistor to eliminate an influence of a threshold voltage of the driving transistor on a light emitting current when the light emitting element emits light.

6. The fingerprint recognition and pixel driving circuit according to claim 5, wherein the pixel driving sub-circuit further comprises:
a fourth transistor, wherein a control terminal of the fourth transistor is configured to serve as the light emission control terminal of the pixel driving sub-circuit, wherein a first terminal of the fourth transistor is configured to receive the power supply voltage, wherein a second terminal of the fourth transistor is electrically connected to a first terminal of the driving transistor, wherein a second terminal and a control terminal of the driving transistor is electrically connected to the threshold voltage compensation circuit, and
a seventh transistor, wherein a first terminal of the seventh transistor is electrically connected to the second terminal of the driving transistor, wherein a second terminal of the seventh transistor is electrically connected to the light emitting element, and wherein a control terminal of the seventh transistor is electrically connected to the threshold voltage compensation circuit.

7. The fingerprint recognition and pixel driving circuit according to claim 6, wherein the threshold voltage compensation circuit comprises:
a storage capacitor, wherein a first terminal of the storage capacitor is electrically connected to the control terminal of the driving transistor to form a third node with the control terminal of the driving transistor;
a fifth transistor, wherein a first terminal of the fifth transistor is grounded, and wherein a second terminal of the fifth transistor is electrically connected to a second terminal of the storage capacitor to form a fourth node with the second terminal of the storage capacitor;
a sixth transistor, wherein a control terminal of the sixth transistor is electrically connected to a control terminal of the fifth transistor and is configured to serve as the third scan terminal of the pixel driving sub-circuit, wherein a first terminal of the sixth transistor is electrically connected to the third node, and wherein a second terminal of the sixth transistor is electrically connected to the second terminal of the driving transistor; and an eighth transistor, wherein a control terminal of the eighth transistor is electrically connected to the control terminal of the seventh transistor and is configured to serve as the first scan terminal of the pixel driving sub-circuit, wherein a first terminal of the eighth transistor is configured to serve as the data writing terminal of the pixel driving sub-circuit, and wherein a second terminal of the eighth transistor is electrically connected to the fourth node;
a ninth transistor, wherein a control terminal of the ninth transistor is configured to serve as the second scan terminal of the pixel driving sub-circuit, wherein a first terminal of the ninth transistor is grounded, and wherein a second terminal of the ninth transistor is electrically connected to the third node.

8. The fingerprint recognition and pixel driving circuit according to claim 1,
wherein the first read terminal of the fingerprint recognition sub-circuit is electrically connected to the third scan line, the reset terminal of the fingerprint recognition sub-circuit is electrically connected to the second scan line, the fingerprint recognition reset phase of the fingerprint recognition sub-circuit coincides with the display reset phase of the pixel driving sub-circuit, the fingerprint acquisition phase of the fingerprint recognition sub-circuit coincides with the display charging phase of the pixel driving sub-circuit, and the fingerprint recognition sub-circuit is configured to stop operating during the compensation transition phase and the light emitting phase of the pixel driving sub-circuit.

9. The fingerprint recognition and pixel driving circuit according to claim 1,
wherein the first read terminal of the fingerprint recognition sub-circuit is electrically connected to the first scan line, and the reset terminal of the fingerprint recognition sub-circuit is electrically connected to the second scan line, the fingerprint recognition reset phase of the fingerprint recognition sub-circuit coincides with the display reset phase of the pixel driving sub-circuit, the fingerprint acquisition phase of the fingerprint recognition sub-circuit overlaps the compensation transition phase and the light emitting phase of the pixel driving sub-circuit, and the fingerprint recognition sub-circuit is configured to stop operating during the display charging phase of the pixel driving sub-circuit.

10. The fingerprint recognition and pixel driving circuit according to claim 1,
wherein the first read terminal of the fingerprint recognition sub-circuit is electrically connected to the first scan line, the reset terminal of the fingerprint recognition sub-circuit is electrically connected to the third scan line, the fingerprint recognition reset phase of the fingerprint recognition sub-circuit coincides with the display charging phase of the pixel driving sub-circuit, the fingerprint acquisition phase of the fingerprint recognition sub-circuit overlaps the compensation transition phase and the light emitting phase of the pixel driving sub-circuit, and the fingerprint recognition sub-circuit is configured to stop operating during the display reset phase of the pixel driving sub-circuit.

11. A display device comprising a plurality of fingerprint recognition and pixel driving circuits according to claim 1.

12. The display device according to claim 11, wherein adjacent ones of the plurality of fingerprint recognition and pixel driving circuits are separated by at least one pixel.

* * * * *